(12) United States Patent
Koyilothu et al.

(10) Patent No.: US 8,269,490 B2
(45) Date of Patent: Sep. 18, 2012

(54) MAGNETIC SURFACE ACOUSTIC WAVE SENSOR APPARATUS AND METHOD

(75) Inventors: Sarinkumar Anakkat Koyilothu, Karnataka (IN); Sankaranarayanan Kalathil, Karnataka (IN)

(73) Assignee: Honeywell International Inc., Morristown, NJ (US)

( * ) Notice: Subject to any disclaimer, the term of this patent is extended or adjusted under 35 U.S.C. 154(b) by 599 days.

(21) Appl. No.: 12/417,894

(22) Filed: Apr. 3, 2009

(65) Prior Publication Data

US 2010/0253326 A1    Oct. 7, 2010

(51) Int. Cl.
*G01R 33/02* (2006.01)
(52) U.S. Cl. .................. 324/244; 324/207.21; 324/260; 324/600; 310/313 R
(58) Field of Classification Search ............. 324/207.21, 324/244, 260, 600; 310/313 R
See application file for complete search history.

(56) References Cited

U.S. PATENT DOCUMENTS

| | | | |
|---|---|---|---|
| 3,660,756 A * | 5/1972 | Maines et al. ............. | 324/76.49 |
| 4,319,189 A | 3/1982 | Cullum, Jr. et al. ........... | 324/208 |
| 4,709,210 A | 11/1987 | Pond ............................ | 324/207 |
| 5,057,800 A | 10/1991 | Hanna ........................... | 333/133 |
| 5,260,615 A | 11/1993 | Sahashi et al. ................. | 310/26 |
| 5,795,993 A * | 8/1998 | Pfeifer et al. ................ | 73/24.01 |
| 5,966,008 A * | 10/1999 | Maier et al. ..................... | 324/96 |
| 5,989,691 A * | 11/1999 | Furukawa et al. ......... | 428/836.3 |
| 6,046,657 A | 4/2000 | Alers et al. .................... | 333/150 |
| 6,229,307 B1 | 5/2001 | Umehara et al. ............. | 324/249 |
| 6,255,813 B1 | 7/2001 | Isomura et al. .............. | 324/249 |
| 6,320,479 B1 | 11/2001 | Alers et al. ................... | 333/154 |
| 6,362,543 B1 | 3/2002 | Ellis ............................... | 310/26 |
| 6,747,449 B1 | 6/2004 | Maylin et al. ................. | 324/247 |
| 6,970,333 B2 * | 11/2005 | Boeve ....................... | 360/324.11 |
| 7,429,127 B2 | 9/2008 | Walker et al. ................. | 374/109 |
| 7,441,326 B2 | 10/2008 | Seyama et al. ............ | 29/603.16 |
| 7,855,564 B2 * | 12/2010 | Sabah et al. .................. | 324/600 |
| 7,942,568 B1 * | 5/2011 | Branch et al. ................. | 366/127 |
| 2002/0130587 A1 | 9/2002 | Shlimak et al. ........... | 310/313 R |
| 2005/0221512 A1 * | 10/2005 | Ito et al. ............................ | 438/3 |
| 2006/0286563 A1 * | 12/2006 | Lin et al. ........................... | 435/6 |
| 2009/0066326 A1 * | 3/2009 | Itoi et al. ....................... | 324/260 |
| 2009/0109048 A1 * | 4/2009 | Spivak et al. ............... | 340/686.6 |

OTHER PUBLICATIONS

Acoustic Sensors Made from Magnetic Nanowires. Jun. 13, 2006. http://www.nanowerk.com/spotlight/spotid=560.php.
C. Hausleitner, R. Steindl, A. Pohl, H. Hauser, A M.J. Goiser, F. Siefert, "Cordless Batteryless Wheel Mouse Application Utilizing Radio Requestable SAW Devices in Combination with the Giant Magneto-Impedance Effect" IEEE Transactions on Microwave Theory and Techniques, vol. 49, No. 4, Apr. 2001.

(Continued)

*Primary Examiner* — Arleen M Vazquez
(74) *Attorney, Agent, or Firm* — Seager Tufte & Wickhem LLC

(57) ABSTRACT

A magnetic sensor that includes a magnetic film deposited on a surface acoustic wave device. The surface acoustic wave device includes an input interdigital transducer and an output interdigital transducer. An RF voltage can be applied at the input interdigital transducer in order to generate acoustic waves, which can travel via the magnetic material to the output interdigital transducer. The application of an external magnetic field alters the conductivity of the magnetic material. Such a change in conductivity attenuates the velocity of the traveling surface acoustic wave and an output frequency due to electro acoustic interaction. The change in the applied magnetic field can be indirectly monitored as a change in output frequency of the SAW device at the output interdigital transducer.

20 Claims, 4 Drawing Sheets

OTHER PUBLICATIONS

Field Programmable Magnetic Surface Acoustic Wave (SAW) Devices for Hybrid Sensor Networks, Investigator: Dr. Dhagat, Osu, Supported by: NSF.

H. Hauser, L. Kraus, P. Ripka, "Giant Magnetoimpedance Sensors", Jun. 2001, IEEE Instrumentation & Measurement Magazine.

H. Hauser, R. Steindl, C. Hausleitner, A. Pohl, J. Nicolics, "Wirelessly Interrogable Magnetic Field Sensor Utilizing Gian Magneto-Impedance Effect and Surface Acoustic Wave Devices", IEEE Transactions on Instrumentation and Measurement, vol. 49, No. 3, Jun. 2000.

Hauser, J. Nicolics, A. Pohl, Magnetic Field Sensor by Giant Magneto-Impedance, 1999 IEEE.

E.M. Simpson, W.F. Robbins, "Magnetostrictive Fe-Si Thin Films for Tunable SAW Devices", IEEE Transactions on Magnetics, vol. Mag-16, No. 5, Sep. 1980.

D.C. Webb, D.W. Forester, A.K. Ganguly and C. Vittoria, Applications of Amorphous Magnetic-Layers in Surface-Acoustic-Wave Devices, IEEE Transactions on Magnetics, vol. Mag-15, No. 6 Nov. 1979.

I. Datskou, S. Rajic, P.G. Datskos, Novel Magnetic and Chemical Micro Sensors for In-situ, Real-time, and Unattended Use, Apr. 1999, SPIE vol. 3713.

R. Steindl, Ch. Hausleitner, A. Pohl, H. Hauser, J. Nicolics. "Passive Wirelessly Requestable Sensors for Magnetic Field Measurements". Elsevier, Sensors and Actuators 85 (2000) 169-174.

S.M. Hanna, F.J. Friedlaender, Surface Acoustic Wave Attenuation in Magnetic Bubble Garnet Films. 1985 American Institute of Physics, J. Appl. Phys. 57 (1), Apr. 15, 1985.

D.W. Forester, C. Vittoria, D.C. Webb, K.L. Davis. "Variable Delay Lines Using Magnetostrictive Metallic-Glass Film Overlays". 1978 American Institute of Physics, J. Appl. Phys. 49(3), Mar. 1978.

H. Chiriac, M. Pletea, E. Hristoforou, Magneto-Surface-Acoustic-Waves Microdevice Using Thin Film Technology: Design and Fabrication Process. Elsevier, Sensors and Actuators A 91 (2001) 107-111.

W.P. Robbins, E.M. Simpson. "Tunable Surfaces Acoustic Wave Oscillators Using Magnetostrictive Thin Films". Proceedings of the IEEE, vol. 67, No. 11, Nov. 1979.

M. Vazquez, "Giant Magneto-Impedance and Applications" Institute of Materials Science, CSIC.

R. Steindi, C. Hausleitner, H. Hauser, W. Bulst. "Wireless Magnetic Field Sensor Employing SAW-Transponder" , 2001 IEEE.

Reindl, "Wireless Passive SAW Identification Marks and Sensors," 2002 IEEE International Frequency Control Symposium and PDA Exhibition, New Orleans, LA, USA, 115 pages, May 29-31, 2002.

* cited by examiner

MAGNETIC SURFACE ACOUSTIC WAVE SENSOR APPARATUS AND METHOD

TECHNICAL FIELD

Embodiments are generally related to magnetic sensor methods and systems. Embodiments are also related to SAW (Surface Acoustic Wave) sensing devices. Embodiments are additionally related to the fabrication of magnetic sensors.

BACKGROUND OF THE INVENTION

Magnetic sensors can be employed for detecting and measuring a magnetic field in various industrial and commercial applications such as, for example, automotive, medical, aerospace, industrial, and computer applications. In such applications, the magnetic sensor can be biased with a magnetic field and electrically excited, typically with a constant current source or a constant voltage source. Examples of magnetic sensors include sensing devices that utilize magnetic sensing elements such as, for example, Hall-effect sensing elements, semiconductor magnetoresistor (SMR) components, anisotropic magnetoresistor (AMR) components, giant magnetoresistor (GMR) components, and so forth.

The majority of Hall-effect based magnetic sensors possess extremely low magnetic field sensitivities at larger air gap operations, which results in poor sensor output signals. AMR and GMR magnetic sensors tend to be more expensive. Hence, it is believed that a solution to these problems involves the implementation of a passive and wireless magnetic sensor with a high magnetic field sensitivity at large air gap operations. In practice, however, it has been difficult to achieve all of these features simultaneously.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved magnetic sensor.

It is another aspect of the present invention to provide for a magnetic sensor based on the use of thin magnetic films and surface acoustic wave components.

The aforementioned aspects and other objectives and advantages can now be achieved as described herein. A magnetic sensor is disclosed, which includes a SAW device comprising an input interdigital transducer and an output interdigital transducer fabricated utilizing, for example, silicon technology. One or more thin films of magnetic material (e.g., magneto impedance (MI), giant magnetoimpedance (GMI), etc.) can be deposited on the SAW device. An external radio frequency (RF) voltage can be applied to the input interdigital transducer in order to generate acoustic waves, which travel via the magnetic film(s) to the output interdigital transducer. The applied external magnetic field alters the conductivity of the magnetic material. This conductivity change attenuates the velocity of the traveling surface acoustic wave(s) and results in an output frequency change due to electro acoustic interaction. The change in the applied magnetic field can be indirectly monitored as a change in the frequency of the SAW device at the output interdigital transducer. The SAW device is responsive to a wireless interrogation signal, which permits the magnetic sensor to operate as a passive and wireless sensing device.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
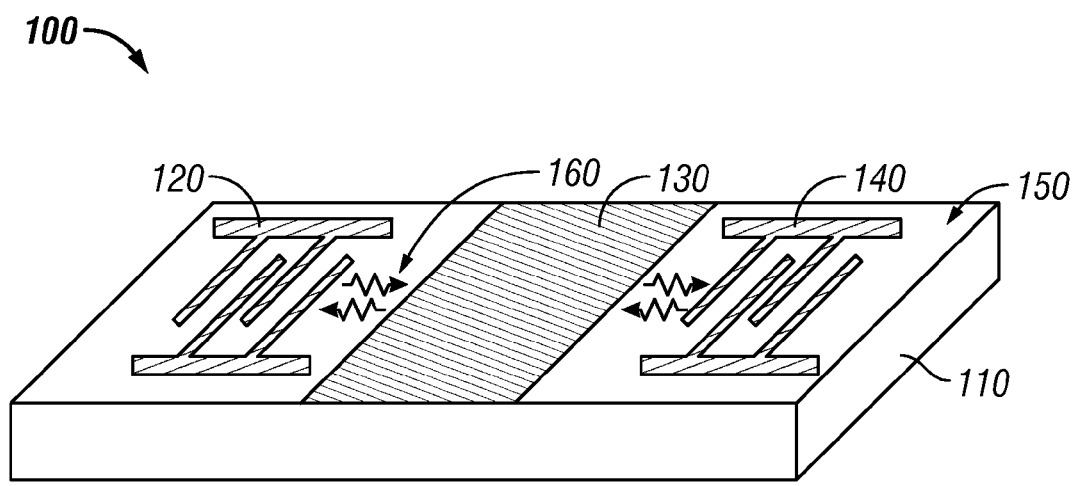
FIG. 1 illustrates a perspective view of a magnetic sensor, in accordance with an embodiment.

FIG. 1 illustrates a perspective view of a sensor 100, in accordance with an embodiment. The sensor 100 can be used in a wide variety of applications such as, for example, consumer, computer, automotive, medicine, and aerospace applications for detecting a magnetic field, to name a few. The magnetic sensor 100 generally includes a SAW device 150 that can be configured utilizing, for example, silicon fabrication technology. The SAW device 150 can be fabricated on a single crystal anisotropic substrate (e.g., piezoelectric material) 110. The substrate 110 may be configured from a material such as, for example, quartz, lithium niobate, lithium tantalate, lanthanum gallium silicate, and so forth. The SAW device 150 can be configured to include one or more intertwined interdigital transducers 120 and 140 capable of converting applied electrical signals into mechanical surface acoustic waves 160. In the example depicted in FIG. 1, a pair of interdigital transducers 120 and 140 is illustrated. It can be appreciated, of course, that many other interdigital transducers may also be configured upon the substrate 110 of the SAW device 150.

Surface acoustic wave(s) 160 can be generated by applying an RF voltage on the interdigital transducer 120. The surface acoustic wave(s) 160 is generated on the surface of the piezoelectric substrate 110 with an amplitude that typically decays exponentially with respect to the depth of the substrate 110. The SAW device 150 can be implemented as a passive and wireless operated device. The sensor 100 further includes a magnetic film 130 deposited on the SAW device 150. The magnetic material that makes up the "thin" magnetic film is selected to exhibit a high sensitivity towards the applied magnetic field.

The magnetic thin film 130 may be configured from magnetic materials such as, for example, magneto impedance (MI) or giant magnetoimpedance (GMI) type. Note that the magnetic material film 130 may also be configured as a nanostructured layer, a single layer or a multilayer magnetic film structure. The magnetic film 130 can be deposited utilizing an appropriate thin film deposition technique. The magnetic film 130 can also be configured in an amorphous and/or crystalline form in association with SAW device 150 to provide a passive device that can be wirelessly operated.

Assuming that the magnetic film 130 is configured in the context of a nanostructured layer (or layers), it can be assumed that the nanostructure is based on a configuration of intermediate size between molecular and microscopic (e.g., micrometer-sized) structures. Thus, a nanostructured layer typically includes a layer size on the order of nanometers (e.g., 10-9 meters).

Examples of magnetic materials appropriate for the magnetic thin film 130 include CoSiB/Ag/CoSiB; CoSiB/SiO2/Cu/SiO2/CoSiB; Co76Fe4B20; Co73Si12B15/Cu/Co73Si12B15; Co85Nb12Zr3; CoSiB/Cu/CoSiB; CoFeB/Cu/CoFeB CoFeSiB, FeCuNbSiB or their derivatives, to name a few. Such magnetic materials can provide for a large GMI effect as high as 700% with field sensitivities up to 300%/Oe as a single entity.

Figure 2:
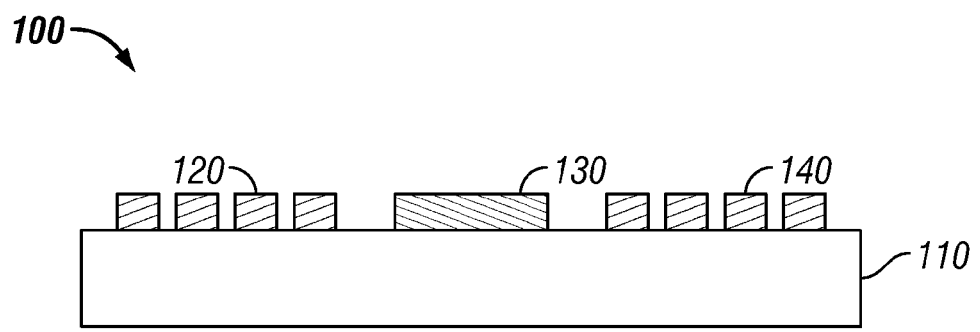
FIG. 2 illustrates a cross-sectional view of the magnetic sensor depicted in FIG. 1, in accordance with an embodiment.

FIG. 2 illustrates a cross-sectional view of the magnetic SAW sensor 100, in accordance with an embodiment. Note that in FIGS. 1-5, identical or similar blocks are generally indicated by identical reference numerals. One or more magnetic films, such as magnetic film 130, can be deposited between the interdigital transducers 120 and 140, assuming that the SAW device 150 functions as Rayleigh SAW device. The magnetic film 130 can be deposited between the interdigital transducers 120 and 140 or elsewhere on the device 150, depending upon design considerations. Deposition of the interdigital transducers 120 and 140 and/or other such transducers may take place during the fabrication process after the contacts pads (not shown) associated with the SAW device 150 are protected with an appropriate protection layer. Note that because of the use of magnetic film 130 and the SAW device 150 in the context of a single device or system, the resulting magnetic sensor 100 can be referred to as a "MAGSAW sensor".

The surface acoustic wave(s) 160 are generated when, for example, an RF (Radio Frequency) voltage is applied at the input interdigital transducer 120. In response to the application of the RF voltage, the surface acoustic wave(s) 160 travel through the magnetic film(s) 130 to the output interdigital transducer 140.

An external magnetic field applicable to the SAW device 150 changes the conductivity of the magnetic material 130. Due to electro-acoustic interaction, such a conductivity change attenuates the velocity of the traveling surface acoustic wave(s) 160 and hence, the frequency output. The change in the applied magnetic field can be indirectly monitored as a change in output frequency of the SAW device 150 at the output interdigital transducer 140. Such an effect can be mathematically defined, for example, by equation (1) below:

$$df/f(H)=dv/v(H) \quad (1)$$

In equation (1) above, the parameter df represents a change in the output frequency of the SAW device 150 due to the external magnetic field and the parameter dv represents the corresponding change in SAW velocity. Along these same lines, the v represents the original SAW velocity and the H indicates the intensity of the magnetic field. The frequency shift can be measured as a function of the applied magnetic field due to the electro acoustic interaction.

Figure 3:
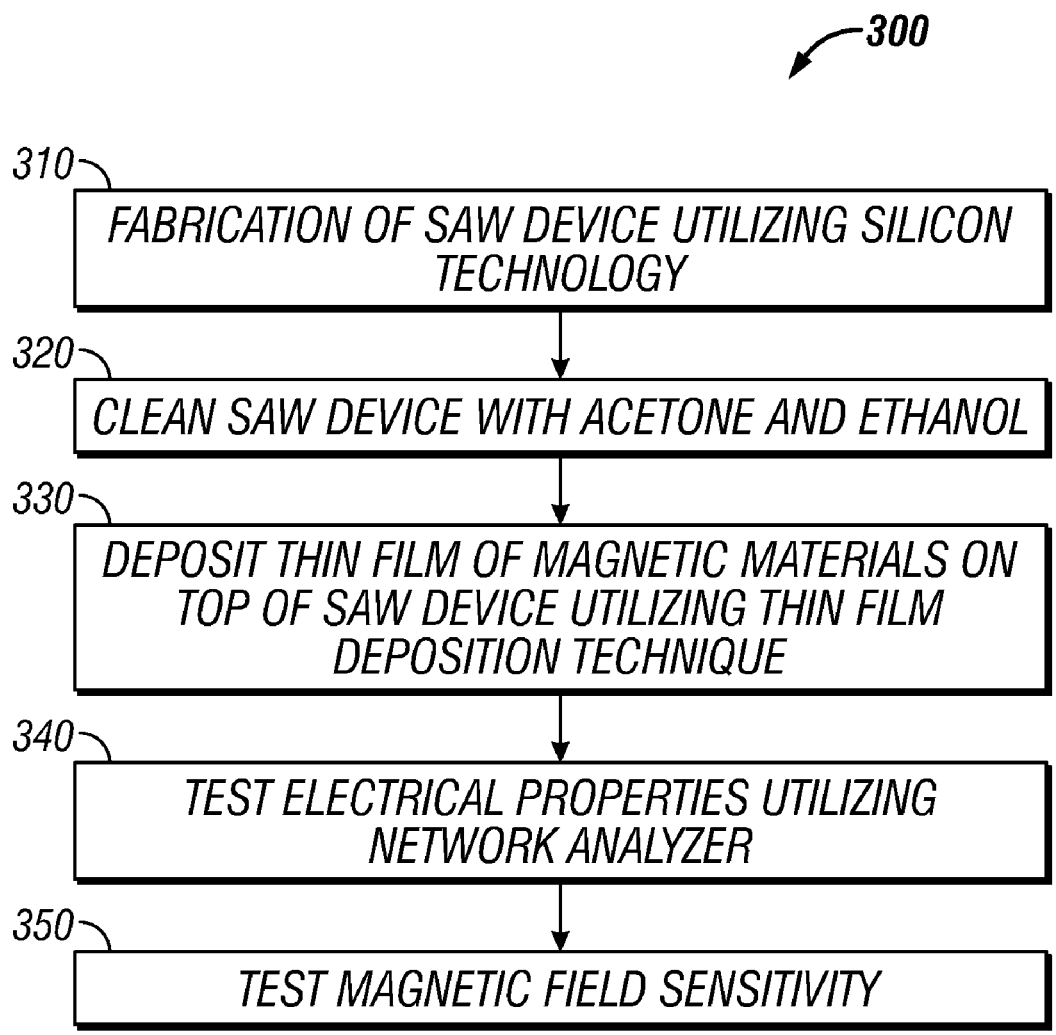
FIG. 3 illustrates a flow chart of operations illustrating a method for fabricating the magnetic sensor depicted in FIGS. 1-2, in accordance with an embodiment.

FIG. 3 illustrates a flow chart of operations illustrating a method 300 for fabricating the sensor 100, in accordance with an embodiment. The SAW device 150 can be fabricated utilizing silicon technology, as depicted at block 310. The SAW device 150 can then be cleaned utilizing acetone and ethanol solutions, as depicted at block 320. The thin film 130 of magnetic materials can be deposited on top of the SAW device 150, as illustrated at block 330. The deposition of the thin film(s) 130 of magnetic materials can be performed, for example, by RF-sputtering the magnetic materials, for example, at room temperature or at an elevated temperature with a specified vacuum inside a sputtering chamber and utilizing the magnetic materials as a sputtering target.

Sputtering is a process whereby atoms are ejected from a solid target material due to bombardment of the target by energetic ions, which can be commonly utilized for thin-film deposition.

The magnetic materials that make up magnetic film 130 can also be coated utilizing a solution of the same magnetic material. Such an approach can be accomplished either by a spin coating system, a spray coating system, brush coating or by screen printing at room temperature and followed by thermal annealing. The thin magnetic films 130 can also be deposited by other physical or chemical vapor deposition techniques. Alternatively, such film(s) 130 can be deposited via electro-deposition techniques. The electrical properties of the SAW device 150 can be tested utilizing a network analyzer, as depicted at block 340. The magnetic field sensitivity associated with the magnetic SAW sensor 100 can then be tested utilizing a varying magnetic field source, frequency counter, and oscillator circuit, as indicated at block 350.

Figure 4:
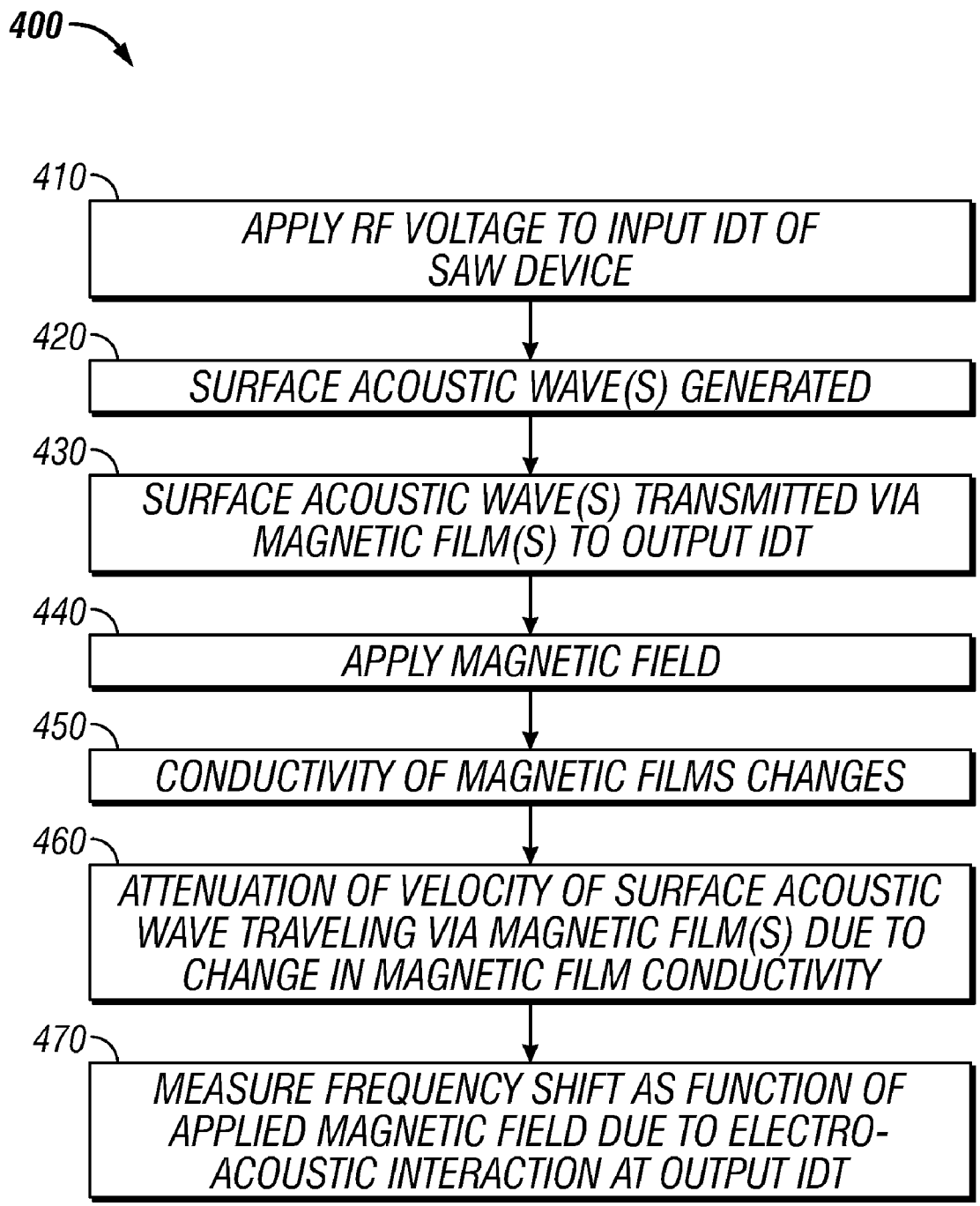
FIG. 4 illustrates a flow chart of operations illustrating logical operational steps of the magnetic sensor of FIGS. 1-2, in accordance with an embodiment.

FIG. 4 illustrates a flow chart of operations illustrating logical operational steps of a method 400 of operating the magnetic sensor 100, in accordance with an embodiment. As depicted at block 410, an external RF voltage can be applied at the input interdigital transducer 120 associated with the SAW device 150. Surface acoustic wave(s) 160 can then be generated, as illustrated at block 420. The surface acoustic wave(s) 160 can be transmitted via thin films 130 of magnetic material to the output interdigital transducer 140, as shown at block 430. Thereafter, a magnetic field can be applied, whose intensity is then measured, as illustrated at block 440. The conductivity of the magnetic material of magnetic film 130 can be changed due to the application of the magnetic field, as depicted at block 450. Next, as illustrated at block 460, the velocity of the surface acoustic wave(s) 160 traveling through the magnetic films 130 can be attenuated due to the change in conductivity of the thin film magnetic materials of magnetic film 130.

The frequency shift can be measured as a function of the applied magnetic field due to the electro acoustic interaction at the output interdigital transducer 140, as depicted at block 470. The thin film 130 of magnetic material can be directly deposited on the SAW device 150. The disclosed embodiments offer a number of advantages.

For example, multilayer GMI films are capable of offering a high magnetoimpedance effect, which generates a high sensitivity. Another advantage is that the sensitivity of the magnetic material of the film 130 is greater than that of existing magnetic sensors with respect to the same applied field. Additionally, a thickness optimization of the magnetic material of film 130 associated with the SAW device 150 improves the electro-acoustic coupling due to the finite size effect of thickness on conductivity.

By utilizing the disclosed embodiments, a frequency shift can be measured as a function of applied magnetic field at the output interdigital transducer 140 associated with the SAW device 150. The magnetic sensor 100 operates based on the acousto-electric effect, wherein the propagation velocity of the surface acoustic waves 160 in the substrate 110 changes in response to the conductivity of the magnetic film 130. The magnetic sensor 100 can be utilized for high reliability measurements of, for example, stray fields of magnetic bar codes.

Figure 5:
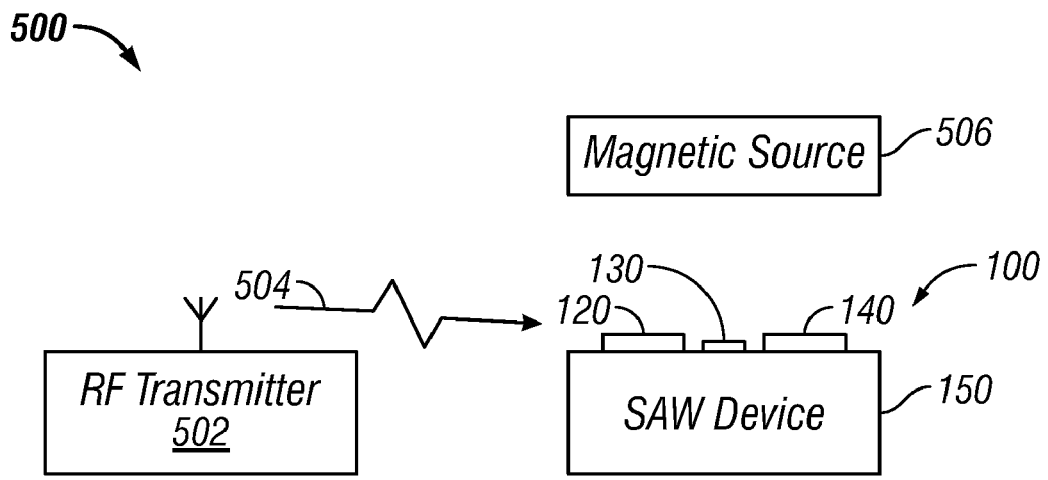
FIG. 5 illustrates a block diagram of a magnetic sensing system that can be implemented in accordance with an embodiment.

FIG. 5 illustrates a block diagram depicting a magnetic sensing system 500, which can be implemented in accordance with an embodiment. The sensing system 500 includes an RF transmitter 502 and the magnetic sensor 100. An RF signal 504 can be transmitted from the RF transmitter 502 to the magnetic sensor 100 for exciting the SAW device 150 and also to interrogate a sensor response provided by the magnetic sensor 100. In the example depicted in FIG. 5, the magnetic sensor 100 is located or disposed near a magnetic source 506 such as, for example, a voltage source or a ferromagnetic material. The RF signal 504 assists in exciting the surface acoustic waves. The magnetic field can originate from a particular source, such as the magnetic field source 506. This magnetic field interacts with the magnetic materials (e.g., magnetic film(s) 130) coated on the SAW device 150. The corresponding change to the materials is then reflected as a frequency shift, which can be interrogated using the RF signal 504.

The thin magnetic film(s) 130 deposited on top of the SAW device 150 undergo a change in conductance and/or impedance, by the application of the external AC/DC magnetic field. This impedance and/or conductance change attenuates the traveling SAW velocity and hence its frequency output due to electro-acoustic interaction. In other words, the change in the applied magnetic field is indirectly monitored as a change in the output frequency of the SAW device 150. The SAW device 150 is thus responsive to the magnetic field and the associated change can be interrogated with via the transmission of an RF signal 504. Such a magnetic field changes the conductivity of the magnetic material of the magnetic film 130 to generate a frequency shift measurable as a function of the magnetic field. It is this frequency shift that can provide an indication of a physical property (e.g., a strength of a magnetic field) detectable by the magnetic sensor 100.

Figure 6:
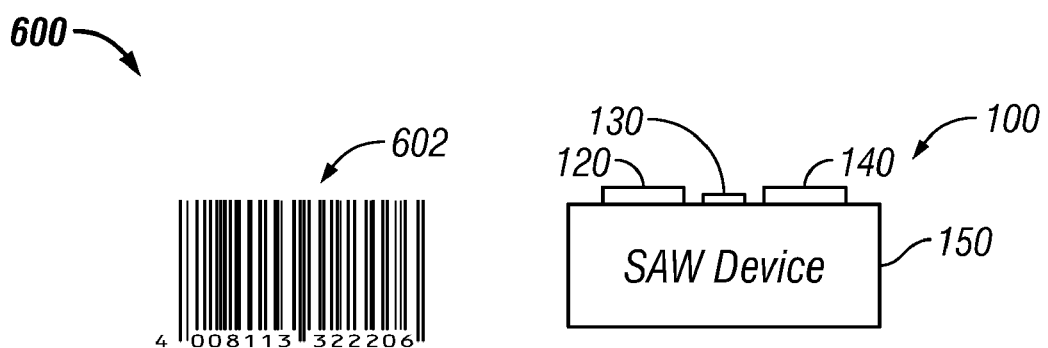
FIG. 6 illustrates a block diagram of the measurement of stray magnetic fields of a bar code, in accordance with an embodiment.

FIG. 6 illustrates a block diagram of a system 600 for measuring stray magnetic fields of a magnetic bar code 602, in accordance with an embodiment. Note that in FIGS. 1-6, identical, similar components or elements are generally indicated by identical reference numerals. As indicated in FIG. 6, the magnetic sensor 100 is capable of measuring stray fields of a magnetic bar code 602. Note that the system 600 depicted in FIG. 6 represents a variation to the system 600 illustrated in FIG. 5. That is, for example, the magnetic bar code 602 constitutes one possible example of the magnetic field source 506 depicted in FIG. 5. It can be appreciated that the RF transmitter 502 depicted in FIG. 5 can be utilized to transmit the RF signal 504 to excite the SAW device 150 shown in FIG. 6 and also to interrogate a sensor response provided by the magnetic sensor 100 depicted in FIG. 6 with respect to the magnetic bar code 602.

The disclosed embodiments provide other extremely important advantages such as offering high magnetic field sensitivity at large air gap operations based on large conductivity changes with respect to the external magnetic field. Various alterations and modifications will occur to those skilled in the art from the foregoing detailed description of the invention and the accompanying drawings. Such a passive wirelessly interrogable magnetic SAW sensor 100 can be utilized, for example, in harsh environments. Additionally, the magnetic film 130 may be formed from magnetoresistive materials as opposed to magnetoimpedance materials. Examples of such magnetoresistive materials include anisotropic magnetoresistance materials, giant magnetoresistance materials, tunneling magnetoresistance materials, and colossal magnetoresistance materials to name a few, as opposed to magneto-impedance materials such the MI and GMI materials discussed herein.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A sensor, comprising:
    a magnetic film; and
    a surface acoustic wave device upon which said magnetic film is located, said surface acoustic wave device responsive to a magnetic field, wherein said magnetic field changes a conductivity of said magnetic material to generate a frequency shift of a surface acoustic wave, wherein the frequency shift is measurable as a function of said magnetic field and indicative of a physical property detectable by said sensor.

2. The sensor of claim 1 wherein said magnetic field originates from a magnetic field source that interacts with said magnetic film located on said surface acoustic wave device.

3. The sensor of claim 1 wherein said magnetic film comprises a magnetoimpedance material.

4. The sensor of claim 1 wherein said magnetic film comprises a giant magnetoimpedance material.

5. The sensor of claim 1 wherein said magnetic film comprises an amorphous material.

6. The sensor of claim 1 wherein said magnetic film comprises a crystalline material.

7. The sensor of claim 1 wherein said magnetic film comprises a nanostructured layer configuration.

8. The sensor of claim 1 wherein said magnetic film comprises a single layer configuration.

9. The sensor of claim 1 wherein said magnetic film comprises a multilayer configuration.

10. A magnetic sensing system, comprising:
    a surface acoustic wave device upon which a magnetic film is located; and
    an RF transmitter that transmits an RF signal for excitation and interrogation of said surface acoustic wave device, wherein said surface acoustic wave device is responsive to a magnetic field that originates from a magnetic field source, wherein said magnetic field interacts with said magnetic film to change a conductivity of said magnetic film to generate a frequency shift of a surface acoustic wave, wherein the frequency shift is measurable as a function of said magnetic field, said frequency shift indicative of a physical property detectable by said sensor.

11. The system of claim 10 wherein said magnetic film comprises a magnetoimpedance material.

12. The system of claim 10 wherein said magnetic film comprises a giant magnetoimpedance material.

13. The system of claim 10 wherein said magnetic film comprises a nanostructured layer configuration.

14. The system of claim 10 wherein said magnetic film comprises a single layer configuration.

15. The system of claim 10 wherein said magnetic film comprises a multilayer configuration.

16. The system of claim 10 wherein said surface acoustic wave device comprises a piezoelectric substrate.

17. The system of claim 10 wherein said magnetic field comprises a magnetoresistive material.

18. A magnetic sensor, comprising:
- a magnetic film;
- a surface acoustic wave device upon which said magnetic film is located, wherein said surface acoustic wave device comprises an input interdigital transducer and an output interdigital transducer; and
- a voltage source for applying an RF voltage with respect to said input interdigital transducer in order to generate an acoustic wave that travels via said magnetic film to said output interdigital transducer; such that an application of a magnetic field changes a conductivity associated with said magnetic material in order to measure a frequency shift of the acoustic wave as a function of said magnetic field and provide an indication of a physical property detectable by said magnetic sensor.

19. The sensor of claim 18 wherein said magnetic film comprises a magnetoimpedance material.

20. The sensor of claim 18 wherein said magnetic film comprises a giant magnetoimpedance material.

\* \* \* \* \*